United States Patent [19]

Vaes et al.

[11] Patent Number: 5,059,508
[45] Date of Patent: Oct. 22, 1991

[54] METHOD FOR PREPARING PLANOGRAPHIC PRINTING PLATE

[75] Inventors: Jos A. Vaes, Betekom; Luc J. Wabbes, Mortsel, both of Belgium

[73] Assignee: AGFA-GEVAERT, N.V., Mortsel, Belgium

[21] Appl. No.: 595,410

[22] Filed: Oct. 11, 1990

[30] Foreign Application Priority Data

Oct. 20, 1989 [EP] European Pat. Off. .......... 89202652

[51] Int. Cl.$^5$ .......................... G03C 5/54; G03C 1/08
[52] U.S. Cl. .................................. 430/204; 430/230; 430/567; 430/573; 430/576; 430/578; 430/944
[58] Field of Search ................ 430/204, 230, 567, 944

[56] References Cited

U.S. PATENT DOCUMENTS

| | | | |
|---|---|---|---|
| 4,501,811 | 2/1985 | Saikawa et al. | 430/204 |
| 4,621,041 | 11/1986 | Saikawa et al. | 430/204 |
| 4,784,933 | 11/1988 | Kanada et al. | 430/204 |
| 4,828,962 | 5/1989 | Grzeskowiak et al. | 430/230 |
| 4,948,699 | 8/1990 | Nishinoiri et al. | 430/204 |
| 4,959,294 | 9/1990 | Lea et al. | 430/204 |

*Primary Examiner*—Richard L. Schilling
*Attorney, Agent, or Firm*—Breiner & Breiner

[57] ABSTRACT

The present invention provides a method of preparing a planographic printing plate comprising the steps of:

(1) exposing a DTR mono-sheet material containing a silver halide emulsion layer and a nuclei containing surface layer in a laser beam containing device, e.g. a helium-neon laser, an argon laser, or a semiconductor laser, wherein the said emulsion layer contains at least one emulsion showing following characteristics:

(a) the emulsion consists principally of silver chloride but contains bromide ranging from 5 mole % to 40 mole % and iodide ranging from 0 to 1 mole %;

(b) the emulsion belongs to the core-shell type wherein substantially all the bromide is concentrated in the core;

(c) the emulsion grains contain Rhodium and/or Iridium dopants;

(2) processing the DTR material by means of a developing or activator solution, containing at least an alkali agent and a silver halide complexing agent, followed by a neutralization solution.

9 Claims, No Drawings

METHOD FOR PREPARING PLANOGRAPHIC PRINTING PLATE

DESCRIPTION

BACKGROUND OF THE INVENTION

The present invention relates to a method for the preparation of a planographic printing plate by the silver complex diffusion transfer method.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. in Japanese Examined Patent Publication (Kokoku) 30562/73, Japanese Unexamined Patent Publications (Kokai) Nos. 21602/78, 103104/79, 9750/81etc.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. Thus, it is known e.g. from the United Kingdom Patent Specification 1,241,661 to produce a planographic printing plate consisting of a sheet material comprising an outer hydrophilic colloid layer on the surface of which there is concentrated a silver image stemming from an underlying exposed silver halide emulsion layer by the silver complex diffusion transfer reversal process.

The developing agent or a mixture of developing agents can be present in an alkaline processing solution and/or in the photographic silver halide emulsion layer material itself. In case the developing agent or a mixture of developing agents is contained in the photographic silver halide emulsion material, the processing solution can be merely an aqueous alkaline solution, substantially free of developing agents, that initiates and activates the development, such alkaline solution being referred to herinafter as "activator solution". On the other hand the express ions "developing solution" and "development type DTR element" as used herinafter are meant as being restricted to "solutions containing developing agents" and "DTR element to be developed with a solution containing developing agents".

Preferred silver halide solvents are watersoluble thiosulphate compounds such as ammonium and sodium thiosulphate, or ammonium and alkali metal thiocyanates. Other useful silver halide solvents (or "complexing agents") are described in the book "The Theory of the Photographic Process" edited by T. H. James, 4th edition, p. 474–475 (1977), in particular sulphites and uracil. Further interesting silver halide complexing agents are cyclic imides, preferably combined with alkanolamines, as described in U.S. Pat. No. 4,297,430 and U.S. Pat. No. 4,355,090. 2-mercaplobenzoic acid derivatives are described as silver halide solvents in U.S. Pat. No. 4,297,429, preferably combined with alkanolamines or with cyclic imides and alkanolamines.

Usually when a photographic DTR-material is intended to serve as lithographic printing plate the developing or activator solution is followed by a so-called neutralization solution containing buffer substances to neutralize the alkaline DTR-material after treatment with the developer or activator bath.

According to a well known conventional embodiment the silver halide emulsion contained in the DTR element is orthochromatically sensitized with a conventional cyanine or merocyanine dye so that said DTR element can be exposed on a process camera using an ordinary light source, e.g. tungsten light. In this conventional embodiment no serious problems of silver halide emulsion sensitivity arise. Commercially available DTR materials according to this conventional method which can be processed to lithographic printing plates are marketed e.g. by MITSUBISHI PAPER MILLS LTD under the trade name SILVERMASTER and by AGFA-GEVAERT N.V. under the trade name SUPERMASTER.

According to more recent developments new types of DTR elements are used as recording materials for phototype-setting and image-setting devices which employ laser beams as their output energy source. According to these so-called "direct to plate" methods these laser-exposed DTR materials are transformed in direct-to-use printing plates containing type- and image information, thus avoiding the intermediate steps as in conventional pre-press work flow.

As a consequence these DTR elements must show a spectral sensitivity matching as closely as possible the emission wavelength of the laser beam in question.

For example, lithographic DTR elements suited for exposure by helium-neon laser (HeNe) or light emitting diode (LED), both devices emitting in the red region of the visual spectrum, are disclosed in U.S. Pat. No. 4,501,811 and Japanese Unexamined Patent Publication (Kokai) Nos. 71055/84 and 75838/85. A commercially available DTR material spectrally sensitized for HeNe exposure is marketed by AGFA-GEVAERT N.V. under the trade name SETPRINT HeNe-plate PP 410.

On the other hand semiconductor lasers, also called laserdiodes, show some advantages compared to other laser types such as low cost price small size and long life time. Generally the emission wavelength of these semiconductor laser beams is longer than 700 nm and mostly longer than 750 nm. A commercial image-setter using infra-red laserdiode source was announced by XENOTRON Co in "Ifra Newspaper Techniques" No 7 (oct. 1985) p. b 27. Photographic materials appropriate for exposure by devices employing such laserdiodes must be sensitized for the near infra-red region of the radiation spectrum. Suitable photographic materials to be used with semiconductor laser device are disclosed in Japanese Unexamined Patent Publication (Kokai) No 61752/85 and U.S. Pat. No. 4,784,933. Commercial infra-red sensitized phototypesetting film and paper were announced by EASTMAN KODAK Co in "Proceedings Lasers in Graphics, Electronic Publishing in the 80's", Vol. 2 (sept. 1985) p. 508.

A photographic DTR material normally comprises a silver halide emulsion mainly consisting of silver chloride in order to obtain a sufficiently high rate of solution of the silver halide and a satisfactory gradation necessary for graphic purposes. Only a small amount of silver bromide and/or silver iodide usually not exceeding 5 mole % is present. However as a consequence of the lower energy output of some lasers, e g. laserdiodes, the sensitivity of these conventional silver chloride DTR emulsions is no longer sufficient when using those types of laser as exposure unit. Apart from the intrinsic lower sensitivity of silver chloride compared to silver bromide it is thought that some unfavorable factors, unimportant when sufficient exposure energy is present, begin to play a role at low energy output of the exposure unit. First, it is supposed that the DTR silver transfer speed is reduced somehow by interference with the spectral sensitizers. Secondly, when strong complexing agents, preferred for producing compact DTR silver, such as thiocyanate or a mixture of agents as described in U.S. Pat. No. 4,297,429 are used, part of the exposed silver chloride is not chemically developed in due time; this results in partial silver complexion and the production of dichroitic fog in the non-image areas. Both phenomena are even more pronounced in the case of the activator type of DTR material and processing solution composition than in the case of the development type.

When one tries however in the DTR material to substitute the silver chloride emulsion by a conventionally prepared emulsion containing chloride and bromide in the hope of gaining sensitivity no sufficient transfer of DTR silver is achieved anymore. This is both the case in the development type of DTR element and in the activator type of DTR element. As a result the maximal density and gradation of the DTR silver image are reduced resulting in a severe deterioration of the image quality and the printing endurance characteristics. After a limited length of printing run the DTR silver image is worn off and the ink acceptance and transfer becomes insufficient so that only a small amount of printed copies can be produced.

It is a purpose of the present invention to overcome the sensitometric difficulties encountered with DTR material and processing solution of both the developing and the activator type, especially in the case of low energy output of the laser exposure unit.

SUMMARY OF THE INVENTION

It is an object of the present invention to provide a method of preparing a planographic printing plate with excellent printing endurance.

The present invention provides a method of preparing a planographic printing plate comprising the steps of:

(1) exposing a DTR mono-sheet material containing a silver halide emulsion layer and a nuclei containing surface layer in a laser beam containing device, e.g. a helium-neon laser, an argon laser, or a semiconductor laser, wherein the said emulsion layer contains at least one emulsion showing following characteristics:

(a) the emulsion consists principally of silver chloride but contains bromide ranging from 5 mole % to 40 mole % and iodide ranging from 0 to 1 mole %;

(b) the emulsion belongs to the core-shell type wherein substantially all the bromide is concentrated in the core;

(c) the emulsion grains contain Rhodium and/or Iridium dopants;

(2) processing the DTR material by means of a developing or activator solution, containing at least an alkali agent and a silver halide complexing agent, followed by a neutralization solution.

It was surprisingly found that with the described type of emulsion DTR materials suited for the spectral region in question could be prepared with satisfying sensitivity and gradation characteristics. As a consequence, treating said DTR materials with a developer or activator followed by a neutralization solution as described produces printing plates with DTR silver images having high DTR silver density and excellent DTR silver morphology resulting in very good printing endurance characteristics. It was certainly unexpected that simply concentrating the bromide part of the halide ions in the core of the silver halide grain and building in small amounts of Rhodium and/or Iridium dopants would overcome the sensitometric disadvantages of too low a sensitivity and gradation, encountered when the bromide is homogeneously distributed.

DETAILED DESCRIPTION OF THE INVENTION

The photographic DTR mono-sheet element contains at least one silver halide emulsion layer and a development nuclei containing image-receiving surface layer but other hydrophilic layers may be present such as a hydrophilic layer intermediate between the support and the emulsion layer, an hydrophilic layer between the emulsion layer and the image-receiving layer, and a backing layer applied at the non light-sensitive side of the support.

According to the present invention the emulsion or emulsions consist principally of silver chloride while a fraction of silver bromide is present ranging from 5 mole % to 40 mole %. The emulsions belong to the core/shell type well known to those skilled in the art in the sense that substantially all the bromide is concentrated in the core. This core contains preferably 10 to 40 % of the total silver halide precipitated while the shell consists preferably of 60 to 90 % of the total silver halide precipitated.

The photographic emulsions can be prepared from soluble silver salts and soluble halides according to different methods as described e.g. by P. Glafkides in "Chimie et Physique Pbotographique", Paul Montel, Paris (1967), by G. F. Duffin in "Photographic Emulsion Chemistry", the Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

The average size of the silver halide grains may range from 0.10 to 0.70 micron, preferably from 0.25 to 0.45 micron.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added according to the present invention. The concentration of these added compounds ranges from $10^{-8}$ to $10^{-3}$ mole per mole $AgNO_3$, preferably between $10^{-7}$ and $10^{-6}$ mole per mole $AgNO_3$. This results in the building in in the silver halide crystal lattice of minor amounts of Iridium and/gr Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72(1951).

The emulsions of the DTR element are spectrally sensitized according to the spectral emission of the laser beam by which the DTR element is meant to be exposed.

In case of exposure by HeNe laser or by laserdiode emitting in the red spectral region, sensitization by a red sensitizing dye is necessary. In case of exposure by An ion laser the intrinsic emulsion sensitivity for the blue spectral region might be sufficient but preferably the sensitivity is enhanced by the addition of a blue sensitizing dye.

Suitable sensitizing dyes for the red and the blue spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, holopolar cyanine dyes, hemicyanine dyes, styryl dyes and hemioxonol dyes. Particularly valuable dyes are those belonging to the cyanine dyes, merocyanine dyes, complex merocyanine dyes.

A preferred red sensitizing dye (Compound I) is:

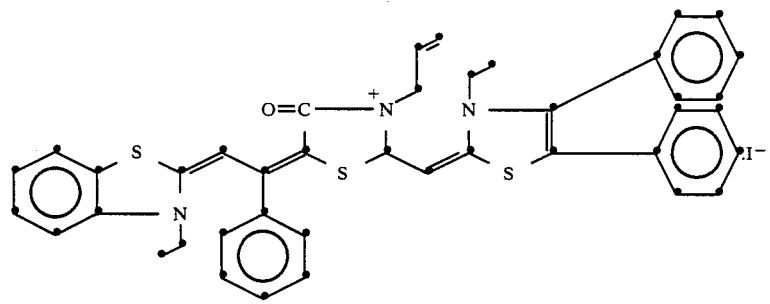

A preferred blue sensitizing dye (Compound II) is:

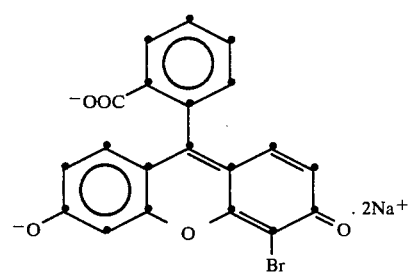

In the case of exposure by a semiconductor laser special spectral sensitizing dyes suited for the near infrared are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888. A preferred infra-red sensitizing dye (Compound III) is:

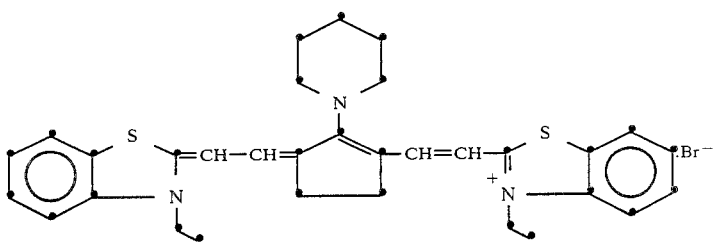

To enhance the sensitivity in the near infra-red region use can be made of so-called supersensitizers in combination with infra-red sensitizing dyes. A preferred supersensitizer is described in Research Disclosure Vol 289, May 1988, item 28952. (Research Disclosure is a publication of Industrial Opportunities Ltd; Homewell, Havant, Hamphire, P09, 1EF, United Kingdom.) The preferred supersensitizer is Compound IV of the Disclosure having the following formula:

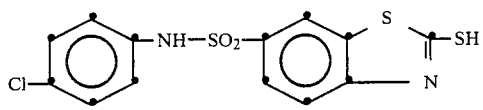

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z Wiss. Photogr. Photophys. Photochem. 47, 2–27 (1952). Other suitable stabilizers are i.a heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a PH value below the isoelectric point of the gelatin to improve the the stability characteristics of the coated layer. Other ingredients such as anti fogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217, and GB-P 7,907,440.

More details about the composition, preparation and coating of silver halide emulsions can be found in e.g. Product Licensing index, Vol. 92, December 1971, publication 9232, p. 107–109.

In a preferred embodiment of the present invention an intermediate hydrophilic layer, serving as antihalation layer, is provided between the support and the silver halide emulsion layer. this layer can contain the same light-absorbing dyes as described above for the emulsion layer; as alternative finely divided carbon black can be used for the same antihalation purposes as described in U.S. Pat. No. 2,327,828. On the other hand, in order to gain sensitivity, light reflecting pigments, e.g. titaniumdioxide can be present. Further this layer can contain hardening agents, matting agents, e.g. silica particles, and wetting agents.

In the image receiving layer, preferred development nuclei are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The silver halide developing agent used in the DTR mono-sheet element or/and the developing solution according to the present invention is preferably a p-dihydroxybenzene compound, e.g. hydroquinone, methylhydroquinone or chlorohydroquinone, preferably in combination with an auxiliary developing agent being a 1-phenyl-3-pyrazolidinone-type developing agent and/or p-monomethylaminophenol. particularly useful auxiliary developing agents are 1-phenyl-3-pyrazolidincne, 1-phenyl-4-monomelhyl-3-pyrazolidinone, and 1-phenyl-4,4-dimethyl-3-pyrazolidinone.

In the case of an activator type of DTR element and processing solution, the hydroquinone-type developing agents are present in the DTR element according to the present invention in an amount of 2.0 to 15 mmole/sq.m. 1-Phenyl-3-pyrazolidinone type developing agents may be present in an amount of 0.5 to 5.0 mmole/sq.m. Preferably these developing agents are located partially in the emulsion layer and partially in the image receiving layer or in (a) hydrophilic colloid layer(s) in water-permeable relationship therewith.

In the case of development type, the hydrochinon type developing agents are preferably present in the developer in a concentration ranging from 100 mmole/l to 400 mmole/l; the 1-phenyl-3-pyrazolidinone type developing agents may be present in a concentration ranging from 10 mmole/l to 100 mmole/l. Even in the development case, developing agents may be present in the DTR material itself, in the same concentration range as in the activator type or less.

In a preferred embodiment of the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g titanium oxide and the usual ingredients like hardeners and wetting agents.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric Point of the gelatin.

But instead of or together with gelatin, use can be made of one or more other natural and/or synthetic hydrophilic colloids, e.g. albumin, casein, zein. Polyvinyl alcohol, alginic acids or salts thereof, cellulose derivatives such as carboxymethyl cellulose, modified gelatin, e.g phthaloyl gelatin etc.

The support of the DTR mono-sheet material may be opaque or transparent e.g. a paper support or resin support. When a paper support is used preference is given to one coated at one or both sides with an alpha-olefin polymer e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) Film, poleycarbonate film, polyvinylchloride film or poly-alpha-olefin films such as polyethylene or polypropylene film. The thickness of such organic resin film is preferably comprised between 0.10 and 0.35 mm. These organic resin supports are preferably coated with a subbing layer which can contain water insoluble particles such as silica or titanium dioxide.

The hydrophilic layers of the photographic element, especially when the binder used is gelatin, can he hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloidlmethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g mucochloric acid and mucophenoxychloric acid These hardeners can be used alone or in combination. The binders can also be hardened with fast-reacting hardeners such as carbamoylpyridinium salts of the type, described in U.S. Pat. No. 4,063,952.

The photographic element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamines, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification as compounds preventing or reducing adhesion, and as compounds improving the photographic characteristics e.g higher contrast, sensItization, and development acceleration.

Development acceleration can be accomplished with the aid of various compounds. Preferably polyalkylene derivatives having a molecular weight of at least 400 such as those described in e.g. U.S. Pat. Nos. 3,038,805-4,038,075-4,292,400.

The photographic element of the present invention may further comprise various other additives such as e.g. compounds improving the dimensional stability of the photographic element, UV-absorbers, spacing agents, hardeners, and plasticizers.

Suitable additives for improving the dimensional stability of the photographic element are i a. dispersions of a water-soluble or hardly soluble synthetic polymer e.g. polymers of alkyl (meth)acrylates, alkoxy(meth)acrylates, qlycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

According to the present invention the alkaline developing or activator solution can contain as silver halide complexing agent a thiocyanate compound, e.g. alkali thiocyanate or ammonium thiocyanate, or a thiosulphate compound, e.g. sodium or ammonium thiosulphate, or a mixture of thiosulphate and thiocyanate. Further interesting silver halide complexing agents, preferred in the present invention, are cyclic imides, preferably combined with alkanolamines, as described in U.S. Pat. No. 4,297,430 and U.S. Pat. No. 4,355,090 and 2-mercaptohenzoic acid derivatives as described in U.S. Pat. No. 4,297,429, preferably combined with alkanolamines or with cyclic imides and alkanolamines.

The developing or activator solution preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mole/l. Further may be present a thickening agent, e.g. hydroxyethylcellulose and carboxymethylcellulose, fog inhibiting agents, e.g. potassium bromide potassium iodide and a benzotriazole, calcium-sequestering compounds, anti-sludge agents, and hardeners including latent hardeners.

The developing or activator solution can contain one or more hydrophobizing agents to enhance the ink-receptive properties of the DTR silver image e.g. those described in U.S. Pat. No. 3,776,728, and U.S. Pat. No. 4,563,410. Preferred compounds are 5-n-heptyl-2-mercapto-,1,3,4,-oxadiazol and 3-mercapto-4-acetamido-5-n.heptyl-1,3,4-triazole.

Further an inorganic alkali agent, e.g. sodium hydroxide is present in the developing or activator solution to establish a pH value ranging from 12 to 14, preferably at least b 12.5. Other alkali agents can be included e.g. secondary and/or tertiary alkanolamines.

Finally, to assure a good spread the developing or activator solution can contain wetting agents, preferably compounds containing perfluorinated alkyl groups.

The developing or activator solution is followed by a neutralization solution. In order to reduce the pH of the wet swollen DTR element leaving the alkaline activator solution, the neutralization liquid contains buffer ions, e.g. phosphate buffer or citrate buffer to establish in said liquid a pH value ranging from 5.0 to 7.0 . The neutralization solution can further contain bactericides, e.g.

phenol, thymol or 5-bromo-5-nitro-1,3-dioxan as described in European Patent Specification Ep 0,150,517. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

According to the present invention the DTR monosheet material is exposed in a laser containing device. Examples of HeNe laser containing exposure units are the image-setters LINOTRONIC 300, marketed by LINOTYPE Co, and CG 9600 marketed by AGFA COMPUGRAPHIC, a division of AGFA CORPORATION. An image-setter provided with an Ar ion laser is LS 210, marketed by Dr-Ing RUDOLF HELL GmbH. Exposure units provided with a laserdiode are LINDTRONIC 200, marketed by LINOTYPE Co, and CG 9400, marketed by AGFA COMPUGRAPHIC, a division of AGFA CORPORATION. Other useful lasers are continuously working He-Cd lasers emitting at 442 nm, continuously working dye lasers optically pumped with $Ar^+$ or frequency doubled YAG lasers and continuously working and pulsed (up to $5.10^4$ Hz) frequency doubled YAG lasers emitting at 532 nm, provided suitably sensitized photographic materials are available.

The development and diffusion transfer can be initiated in different ways e.g. by rubbing with a roller that has been wetted with the processing liquid, e.g. acts as meniscus coater, by wiping with an absorbent means e.g with a plug of cotton or sponge, or by dip ping the material to be treated in the liquid composition. Preferably, they proceed in an automatically operated apparatus such as RAPILINE SP 430, marketed by AGFA. The DTR-process is normally carried out at a temperature in the range of 10° C. to 35° C. In order to minimize the quality loss due to hath exhaustion, regenerating liquids can be added in proportion to the consumption of processing liquids.

The following examples illustrate the present invention without however, limiting it thereby. All parts, percentages and ratios are by weight unless otherwise indicated.

EXAMPLE 1

A gelatino silver halide emulsion was prepared by double jet precipitation by slowly mixing with stirring an aqueous solution of $AgNO_3$ having a concentration of 2 mole/l, and an aqueous solution having a concentration of 1.7 mole/l of NaCl, 0.48 mole/l of KBr and 0.001 mole/l of KI. Before the precipitation $5.10^{-4}$ mole/l of sodium hexachlororhodaat was added to the silver nitrate solution. In a second part of the precipitation an aqueous solution of $AgNO_3$ having a concentration of 1 mole/l was slowly mixed with an aqueous solution of NaCl at a concentration of 1.3 mole/l.

The temperature during the silver halide formation was 55 ° C.

The obtained core-shell emulsion was cooled, flocculated and washed. Gelatin was added in an amount sufficient to reach a ratio of ] by weight of gelatin to silver halide, expressed as equivalent amount of silver nitrate.

Subsequently a chemical ripening was carried out in a conventional way known to those skilled in the art using thiosulphate and gold salts.

Finally the emulsion was sensitized for the red spectral region by using Compound I mentioned in the description.

A photographic DTR mono-sheet material was prepared as follows. One side of a paper support weighing 135 $g/m^2$ and coated on both sides with polyethylene was subjected to corona discharge and then coated with two layers by a double layer coating technique the layer nearer to the support being the antihalation layer and the other being the emulsion layer. The emulsion was coated at an amount of silver halide corresponding to 1.5 g $AgNO_3/m^2$. This emulsion layer contained 0. $g/m^2$ of 1-phenyl-3-pyrazolidinone and 1.0 $g/m^2$ of gelatin.

The antihalation layer contained carbon black, silica particles of 5 micron average size and gelatin at 3 $g/m_2$. The gelatin was lime treated, substantially free of calcium ions (1000 ppm or less) and of the high viscosity type (not less than 85 m.Pa.s at 40° C. for a 10% solution).

After drying these layers were subjected to a temperature of 40° C. for 5 days and then overcoated with a layer containing PdS nuclei, hydrochinon at 0.4 $g/m^2$ and formaldehyde at 100 $mg/m^2$.

The following processing solutions were prepared:

| Activator solution | |
| --- | --- |
| sodium hydroxide | 25 g |
| sodium sulphite anh. | 40 g |
| potassium thiocyanate | 20 g |
| 3-mercapto-4-acetamido-5-n.heptyl-1,2,4-triazole | 0.5 g |
| water to make | 1 l |
| Neutralization solution | |
| citric acid | 10 g |
| sodium citrate | 35 g |
| cysteine | 1 g |
| sodium sulphite anh. | 5 g |
| phenol | 50 mg |
| water to make | 1 l |
| Dampening solution | |
| water | 880 ml |
| citric acid | 6 g |
| boric acid | 8.4 g |
| sodium sulphate anh. | 25 g |
| ethyleneglycol | 100 g |
| colloidal silica | 28 g |

The above described DTR material was image-wise exposed in the HeNe laser containing image-setter CG 9600, marketed by AGFA COMPUGRAPHIC, a division of AGFA CORPORATION, subsequently treated with the described activator solution for 10 seconds at 30 ° C., thereupon treated with the described neutralization solution at 25 ° C. and finally dried.

The printing plate thus prepared was mounted on an offset printing machine (AB Dick 350 CD - trade name for offset printing machine manufactured by AB DICK Co). During the printing run the described dampening solution was used in each case.

The sensitometric properties of this material were characterized by the minimal and maximal reflection density, the gradation measured between 25% and 75% of the maximal density, and the sensitivity (5) expressed as relative log Et value determined at density 1.0.

The lithographic properties printing endurance and background stain were evaluated as follows:

a) printing endurance: number of printed copies before disappearance of ink in the ink accepting areas begins to occur:

X: 2000-5000
O: more than 5000 b) background stain: the feeding of paper was started as soon as the inking roll was brought into contact with the surface of the printing plate; copies obtained after 1000 Impressions were evaluated as follows:
O: no stain
: partial stain or slight stain over the non-image areas
X: heavy stain all over the non-image areas.

EXAMPLE 2

As example 1 but in the first part of the precipitation the concentration of $AgNO_3$ amounted to 3 mole/1 and the concentration of NaCl amounted to 3 mole/l. The second part of the precipitation was omitted so that no core-shell emulsion was obtained.

EXAMPLE 3

As example 1 but in the first part of the precipitation the concentration of NaCl was 0.2 mole/1 and the concentration of KBr was 1.5 mole/1.

EXAMPLE 4

As example 1 with the exception that the concentration of KBr in the first part of the precipitation was only 0.06 mole/l.

The sensitometric and lithographic results concerning examples 1 to 4 are represented in Table 1. The % $Br^-$ means the molar percentage of KBr in reference to the total molar amount of $AgNO_3$.

TABLE 1

| example | % $Br^-$ | Dmin | Dmax | gradation | S | stain | endurance |
|---|---|---|---|---|---|---|---|
| 1 | 16 | 0.63 | 1.30 | 0.85 | reference | O | O |
| 2 | 16 | 0.78 | 1.16 | 0.22 | −0.30 | # | X |
| 3 | 50 | 0.53 | 0.97 | 0.42 | +0.10 | # | X |
| 4 | 2 | 0.65 | 1.28 | 0.50 | −0.30 | # | X |

Table 1 illustrates the favourable effect of the use of a core-shell emulsion and the unfavorable effect of too high or too low a bromide concentration.

EXAMPLE 5

The emulsion of example 1 was sensitized for wavelengths above 700 nm instead of for the red spectral region with a super sensitizing mixture of Compound III and Compound IV mentioned in the description.

EXAMPLE 6

As the previous example 5 but in this case the emulsion of example 2 instead of the emulsion of example 1 was infra-red sensitized.

The thus prepared DTR mono-sheet elements were exposed in the laserdiode containing image-setter CG 9400, marketed by ACFA COMPUGRAPHIC, a division of AGFA CORPORATION.

The sensitometric and lithographic results of examples 5 and 6 are summarized in Table 2.

TABLE 2

| example | Dmin | Dmax | gradation | S | stain | endurance |
|---|---|---|---|---|---|---|
| 5 | 0.65 | 1.25 | 0.50 | ref. | O | O |
| 6 | 0.63 | <1.00 | — | — | O | X |

Table 2 illustrates again the advantage of the core-shell type emulsion.

EXAMPLE 7

A DTR element was prepared as in example 5 but in this case the DTR material contained no developing agents (no hydrochinon nor 1-phenyl-3-pyrazolidone). The following developing solution was prepared:

| | |
|---|---|
| sodium hydroxide | 25 g |
| sodium sulphite anh. | 40 g |
| sodium thiosulphate anh. | 4 g |
| potassium thiocyanate | 12 g |
| hydrochinon | 20 g |
| 1-phenyl-4-monomethyl-3-pyrazolidone | 5 g |
| ethylenediamine-tetra-acetic acid, disodium salt | 2 g |
| 3-mercapto-4-acetamido-5-n.heptyl-1,2,4-triazole | 0.5 g |
| water to make | 1000 ml |

The thus prepared DTR mono-sheet element was exposed in the laserdiode containing image-setter CG 9400, marketed by AGFA COMPUGRAPHIC, a division of AGFA CORPORATION, subsequently treated with the described developing solution for a 10 sec at 25° C., thereupon treated with the above described neutralization solution at 25° C. and finally dried.

The printing procedure was as described in example 1.

EXAMPLE 8

As example 7 but the DTR material contained the infra-red sensitized emulsion of example 6.

EXAMPLE 9

As example 7 but the DTR material contained the emulsion of example 4 with the modification that this emulsion was sensitized for the near infra-red region instead of for the red spectral region with a mixture of Compound III and Compound IV as was the case in examples 5 to 8.

The sensitometric and lithographic results concerning examples 7 to 9 are represented in table 3:

TABLE 3

| example | % $Br^-$ | Dmin | Dmax | gradation | S | stain | endurance |
|---|---|---|---|---|---|---|---|
| 7 | 16 | 0.66 | 1.27 | 0.60 | ref. | O | O |
| 8 | 16 | 0.60 | 1.10 | 0.29 | −0.10 | # | X |
| 9 | 2 | 0.54 | 1.18 | 0.86 | −0.50 | O | X |

Table 3 illustrates, as the previous tables, the superior properties of the DTR element containing a core-shell emulsion with the right bromide content according to the present invention.

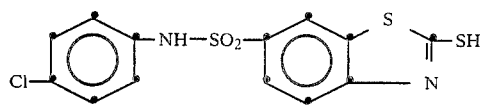

We claim:
1. Method of preparing a planographic printing plate comprising the steps of:
(1) exposing a DTR mono-sheet material containing a silver halide emulsion layer and a nuclei containing surface layer in a laser beam containing device, wherein the said emulsion layer contains at least one emulsion showing following characteristics:
  (a) the emulsion consists principally of silver chloride but contains bromide ranging from 5 mole % to 40 mole % and iodide ranging from 0 to 1 mole %;
  (b) the emulsion belongs to the core-shell type wherein substantially all the bromide is concentrated in the core;

(c) the emulsion grains contain Rhodium and/or iridium dopants;

(2) processing the DTR material by means of a developing or activator solution, containing at least an alkali agent and a silver halide complexing agent, followed by a neutralization solution.

2. Method according to claim 1 wherein the said laser containing device contains a helium-neon laser, an argon laser or a semiconductor laser.

3. Method according to claim 1 wherein the said DTR material and the processing solution belong to the activator type.

4. Method according to claim 1 wherein the said DTR material contains hydroquinone-type developing agents in an amount of 2.0 to 15 mmole/sq.m. and 1-phenyl-3-pyrazolidinone type developing agents in an amount of 0.5 to 5.0 mmole/sq.m.

5. Method according to claim 1 wherein the said Rhodium and/or Iridium dopants are added during the precipitation stage in a concentration ranging from $10^{-8}$ to $10^{-3}$ mole per mole $AgNO_3$.

6. Method according to claim 1 wherein the said Rhodium and/or Iridium dopants are added during the precipitation stage in a concentration ranging from $10^{-6}$ to $10^{-7}$ mole per mole $AgNO_3$.

7. Method according to claim 1 wherein the said core-shell emulsion is spectrally sensitized.

8. Method according to claim 7 wherein the said core-shell emulsion is infra-red sensitized.

9. Method according to claim 8 wherein the said core-shell emulsion is infra-red sensitized with a super sensitizing mixture consisting of:

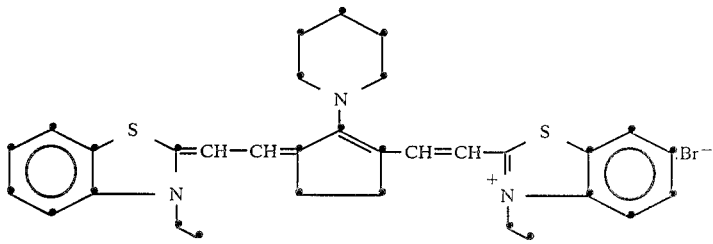

and